United States Patent
Zeng et al.

(10) Patent No.: US 9,812,210 B2
(45) Date of Patent: Nov. 7, 2017

(54) POWER OFF PERIOD ESTIMATING METHOD FOR SOLID STATE STORAGE DEVICE

(71) Applicants: Lite-On Electronics (Guangzhou) Limited, Guangzhou (CN); LITE-ON TECHNOLOGY CORPORATION, Taipei (TW)

(72) Inventors: Shih-Jia Zeng, Taipei (TW); Jen-Chien Fu, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/191,701

(22) Filed: Jun. 24, 2016

(65) Prior Publication Data
US 2017/0271020 A1     Sep. 21, 2017

(30) Foreign Application Priority Data
Mar. 16, 2016   (CN) .......................... 2016 1 0151191

(51) Int. Cl.
*G11C 16/26* (2006.01)
*G11C 16/30* (2006.01)
*G11C 16/16* (2006.01)
*G06F 11/07* (2006.01)

(52) U.S. Cl.
CPC ............ *G11C 16/26* (2013.01); *G06F 11/076* (2013.01); *G06F 11/079* (2013.01); *G06F 11/0727* (2013.01); *G11C 16/16* (2013.01); *G11C 16/30* (2013.01)

(58) Field of Classification Search
CPC ......... G11C 16/26; G11C 16/16; G11C 16/30; G06F 12/00; G06F 11/00; G06F 11/0727; G06F 11/076; G06F 11/079
USPC ........................................ 365/185.11, 185.17
See application file for complete search history.

(56) References Cited

U.S. PATENT DOCUMENTS

| | | | | |
|---|---|---|---|---|
| 8,923,088 B2 * | 12/2014 | Chen | ...................... | G11C 16/30 365/185.33 |
| 8,929,140 B2 * | 1/2015 | Nagashima | .......... | G06F 11/1048 365/185.11 |
| 8,958,243 B2 * | 2/2015 | Zeng | .................. | G11C 16/3427 365/185.02 |
| 9,047,982 B2 * | 6/2015 | Zeng | .................... | G11C 11/5628 |

(Continued)

*Primary Examiner* — Anthan Tran
*Assistant Examiner* — Mushfique Siddique
(74) *Attorney, Agent, or Firm* — WPAT, PC

(57) ABSTRACT

A power-off period estimating method for a solid state storage device is provided. A memory array of a non-volatile memory of the solid state storage device includes plural blocks. Firstly, a first quality parameter of a first block of the plural blocks is calculated before the solid state storage device is powered off. When the first block is corrected at a first time counting value, a first read voltage set of the first block is acquired and the first time counting value is recorded. Then, the first block is corrected after the solid state storage device is powered on, so that a second read voltage set of the first block is acquired. Then, a power-off period is calculated according to the first quality parameter, the first read voltage set, the second read voltage set and the first time counting value.

3 Claims, 5 Drawing Sheets

(56) References Cited

U.S. PATENT DOCUMENTS

| | | | | |
|---|---|---|---|---|
| 9,129,698 B2* | 9/2015 | Zeng | ................. | G11C 16/34 |
| 9,490,024 B1* | 11/2016 | Zeng | ................. | G11C 16/26 |
| 9,514,848 B2* | 12/2016 | Wu | ................. | G11C 11/5642 |
| 9,691,487 B2* | 6/2017 | Choi | ................. | G11C 16/26 |
| 2012/0239976 A1* | 9/2012 | Cometti | ................. | G11C 16/26 |
| | | | | 714/24 |
| 2013/0007543 A1* | 1/2013 | Goss | ................. | G11C 16/3418 |
| | | | | 714/718 |
| 2013/0332791 A1* | 12/2013 | Chu | ................. | G06F 12/0246 |
| | | | | 714/752 |
| 2014/0108747 A1* | 4/2014 | Seol | ................. | G06F 12/00 |
| | | | | 711/154 |
| 2014/0310445 A1* | 10/2014 | Fitzpatrick | ................. | G11C 16/20 |
| | | | | 711/103 |
| 2015/0039842 A1* | 2/2015 | Fitzpatrick | ................. | G06F 12/00 |
| | | | | 711/154 |
| 2015/0261617 A1* | 9/2015 | Choi | ................. | G11C 11/5642 |
| | | | | 714/6.22 |
| 2015/0262697 A1* | 9/2015 | Kim | ................. | G11C 16/32 |
| | | | | 711/103 |
| 2015/0347029 A1* | 12/2015 | Kotte | ................. | G06F 3/0611 |
| | | | | 711/103 |
| 2015/0357043 A1* | 12/2015 | Im | ................. | G11C 16/349 |
| | | | | 365/185.11 |
| 2016/0004437 A1* | 1/2016 | Kim | ................. | G11C 29/021 |
| | | | | 714/764 |
| 2017/0131924 A1* | 5/2017 | Main | ................. | G06F 3/0619 |
| 2017/0177226 A1* | 6/2017 | Lee | ................. | G06F 1/3287 |

* cited by examiner

POWER OFF PERIOD ESTIMATING METHOD FOR SOLID STATE STORAGE DEVICE

This application claims the benefit of People's Republic of China Patent Application No. 201610151191.0, filed Mar. 16, 2016, the subject matter of which is incorporated herein by reference.

FIELD OF THE INVENTION

The present invention relates to a power-off period estimating method, and more particularly to a power-off period estimating method for a solid state storage device.

BACKGROUND OF THE INVENTION

As is well known, solid state storage devices such as SD cards or solid state drives (SSD) are widely used in various electronic devices.

FIG. 1 is a schematic functional block diagram illustrating a conventional solid state storage device. As shown in FIG. 1, the solid state storage device 10 comprises an interface controller 101 and a non-volatile memory 105. The non-volatile memory 105 further comprises a memory array 109 and an array control circuit 111.

The solid state storage device 10 is connected with a host 14 through an external bus 12. Generally, the external bus 12 is an USB bus, a SATA bus, a PCIe bus, or the like. Moreover, the interface controller 101 is connected with the non-volatile memory 105 through an internal bus 113. According to a write command from the host 14, the interface controller 101 controls the array control circuit 111 to store the write data from the host 14 to the non-volatile memory 105. Alternatively, according to a read command from the host 14, the interface controller 101 controls the array control circuit 111 to acquire a read data from the non-volatile memory 105. In addition, the read data is transmitted to the host 14 through the interface controller 101.

Generally, the memory array 109 comprises plural memory cells. Depending on the data amount to be stored in the memory cell, the memory cells may be classified into three types, i.e. a single-level cell (SLC), a multi-level cell (MLC) and a triple-level cell (TLC). The SLC can store only one bit of data per cell. The MLC can store two bits of data per cell. The TLC can store three bits of data per cell.

In the memory array 109, each memory cell comprises a floating gate transistor. By adjusting the number of hot carriers injected into a floating gate of the floating gate transistor, the array control circuit 111 controls the storing state of the floating gate transistor. In other words, the floating gate transistor of each SLC has two storing states, the floating gate transistor of each MLC has four storing states, and the floating gate transistor of each TLC has eight storing states.

Moreover, a threshold voltage ($V_{TH}$) of the floating gate transistor is determined according to the amount of the hot carriers stored in the floating gate. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the solid state storage device, the interface controller 101 commands the array control circuit 111 to change the amount of the hot carriers to be injected into the floating gate. Consequently, the threshold voltage of the floating gate transistor is correspondingly changed. During a read cycle, the array control circuit 111 provides a read voltage to the floating gate transistor, and determines the storing state of the floating gate transistor by judging whether the floating gate transistor is turned on or not.

FIG. 2A schematically illustrates the threshold voltage distribution curves of triple-level cells in different storing states. According to the number of injected hot carriers, the triple-level cell has eight storing states which are marked as "000"~"111". Before the hot carriers are injected into the memory cell, the memory cell is in a storing state "000". That is, after an erase cycle, the memory cell is restored to the storing state "000", and no hot carriers are retained in the memory cell. During a program cycle, as the number of the injected hot carriers increases, the memory cell is sequentially drifting in the other seven storing states.

In practice, even if many memory cells are in the same storing state during the program cycle, the threshold voltages of these cells are not all identical. That is, the threshold voltages of these memory cells are distributed in a specified distribution curve with a median threshold voltage. The median threshold voltage of the memory cells in the storing state "000" is 0V. The median threshold voltage of the memory cells in the storing state "001" is 5V. The median threshold voltage of the memory cells in the storing state "010" is 10V. The median threshold voltage of the memory cells in the storing state "011" is 15V. The median threshold voltage of the memory cells in the storing state "100" is 20V. The median threshold voltage of the memory cells in the storing state "101" is 25V. The median threshold voltage of the memory cells in the storing state "110" is 30V. The median threshold voltage of the memory cells in the storing state "111" is 35V. That is to say, the median threshold voltage for a greater number of memory cells in the storing state "001" is 5V.

Please refer to FIG. 2A again. According to the above characteristics of the triple-level cell, a read voltage set including seven read voltages Vra~Vrg is defined. During the read cycle, the array control circuit 111 provides, in a pre-defined order, the seven read voltages of the read voltage set to a word line (not shown) in order to detect the storing states of the triple-level cells.

For example, when the read voltage Vrd is provided to the memory array 109, a most significant bit (MSB) of the memory cell can be determined. If the threshold voltage of the memory cell is lower than the read voltage Vrd and the memory cell can be turned, the array control circuit 111 judges that the MSB of the memory cell is "0". Whereas, if the threshold voltage of the memory cell is higher than the read voltage Vrd and the memory cell cannot be turned, the array controlling circuit 111 judges that the MSB of the memory cell is "1".

Moreover, after the array control circuit 111 judges that the MSB of the memory cell is "0", the array control circuit 111 further provides the read voltages Vra, Vrb, and Vrc in a pre-defined order to judge the other two bits of the memory cell. Similarly, after the array control circuit 111 judges that the MSB of the memory cell is "1", the array control circuit 111 further provides the read voltages Vre, Vrf, and Vrg in a pre-defined order to judge the other two bits of the memory cell. In other words, the storing state of the triple-level cell is determined according to the read voltages Vra~Vrg.

Moreover, the memory array 109 of the non-volatile memory 105 is divided into plural blocks. The array control circuit 111 reads the triple-level cells of the blocks according to the corresponding read voltage sets. For example, in case that the memory array 109 contains 1024 blocks, the interface controller 101 may record 1024 read voltage sets corresponding to the 1024 blocks and reads to corresponding blocks through the array control circuit 111.

However, after the non-volatile memory 105 has been used for a certain period of time, the characteristics of the triple-level cells are subjected to changes. That is, the hot carriers are gradually ejected from the floating gate of the triple-level cell with the increasing of time. Under this circumstance, the threshold voltage distribution curves of the storing states of all memory cells in the non-volatile memory 105 are possibly changed, and the median threshold voltages are shifted. For solving this drawback, during an idle period, the interface controller 101 performs a background monitoring operation on a first block to monitor the changes of the read voltage sets of the corresponding blocks and modifies the read voltage sets if necessary. The term "idle period" indicates that electric power is supplied to the solid state storage device 10 but no data are transmitted between the solid state storage device 10 and the host 14.

FIG. 2B schematically illustrates the shift of the threshold voltage distribution curves of triple-level cells in different storing states. After the solid state storage device 10 has been powered off for a long enough time, the threshold voltage distribution curves of triple-level cells are possibly shifted. The interface controller 101 cannot perform the background monitoring operation when the solid state storage device 10 is powered off. Once the solid state storage device 10 is powered on again, the interface controller 101 commands the array control circuit 111 to read the data of a corresponding block according to the read voltage set including the previous read voltages Vra~Vrg. Since the previous read voltage set is not suitable for this threshold-voltage-shifted block, a great number of error-read bits are generated and thus the read data fail to be error corrected.

For accurately acquiring the read data, the interface controller 101 performs a red retry process to acquire accurate read voltage set. During the read retry process, the interface controller 101 selects one read voltage set of plural read voltage sets (e.g., M read voltage sets) from a retry table. Moreover, the array control circuit 111 reads the triple-level cells of a block according to the updated read voltage set.

If the data is not successfully read according to the selected read voltage set, the interface controller 101 selects another read voltage set of plural read voltage sets from the retry table, and the array control circuit 111 reads the triple-level cells of the block according to the updated read voltage set again. The above procedure is repeatedly done until the triple-level cells of the block are successively read according to a specified read voltage set including the read voltages Vra'~Vrg'. In the worst situation, the interface controller 101 has to perform the read retry process for M times in order to accurately acquire the read voltage set.

For example, the memory array 109 of the non-volatile memory 105 contains 1024 blocks. For accurately acquiring the read voltage sets corresponding to the 1024 blocks, the interface controller 101 performs the read retry process for 1024×M times in the worst situation. Moreover, if the data is not successfully read according to the M read voltage sets of the retry table, it is necessary to use a special algorithm to find out the suitable read voltage set. Under this circumstance, it takes longer time to acquire the data.

As mentioned above, after the solid state storage device 10 has been powered off for a certain period of time, the threshold voltage distribution curves of triple-level cells are possibly shifted. Since the interface controller 101 has to consume much resource to perform the read retry process, the access speed of the solid state storage device 10 is largely reduced. In the worst situation, the access speed is about 5%~10% of the optimal access speed.

SUMMARY OF THE INVENTION

An embodiment of the present invention provides a power-off period estimating method for a solid state storage device. The solid state storage device includes a non-volatile memory. A memory array of the non-volatile memory includes plural blocks. The power-off period estimating method includes the following steps. Firstly, a first quality parameter of a first block of the plural blocks is calculated before the solid state storage device is powered off. When the first block is monitored and threshold-voltage-corrected at a first time counting value, a first read voltage set of the first block is acquired and the first time counting value is recorded. Then, the first block is also being monitored and threshold-voltage-corrected after the solid state storage device is powered on, so that a second read voltage set of the first block is acquired. Then, a power-off period is calculated according to the first quality parameter, the first read voltage set, the second read voltage set and the first time counting value.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a power-off period estimating method for a solid state storage device. The power-off period estimating method is used for estimating a power-off period of the solid state storage device and compensating a read voltage set. When the solid state storage device is powered on again, a control circuit estimates the power-off period and can quickly calculate the corresponding optimal read voltage sets of all blocks according to the information of the power-off period.

Figure 1:
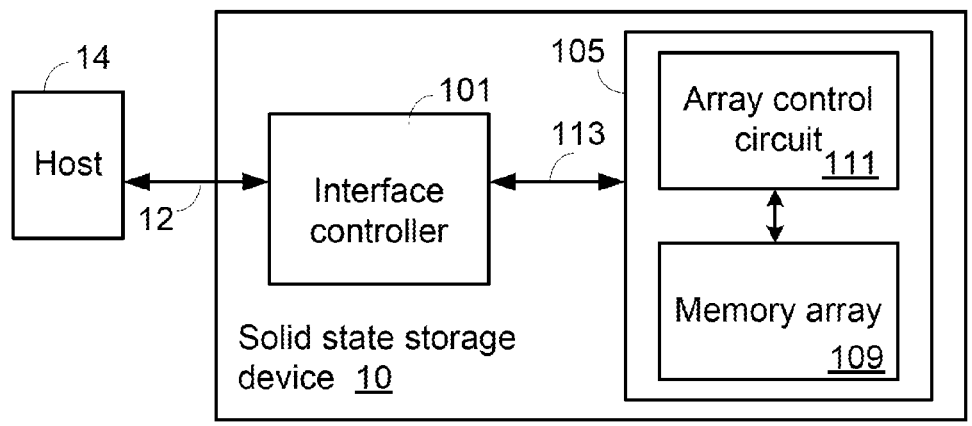
FIG. 1 (prior art) is a schematic functional block diagram illustrating a conventional solid state storage device.
Figure 2A:
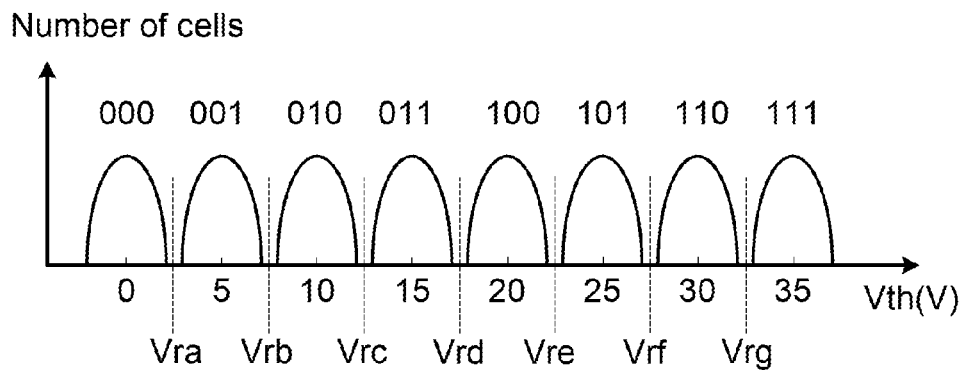
FIG. 2A (prior art) schematically illustrates the threshold voltage distribution curves of triple-level cells in different storing states.
Figure 2B:
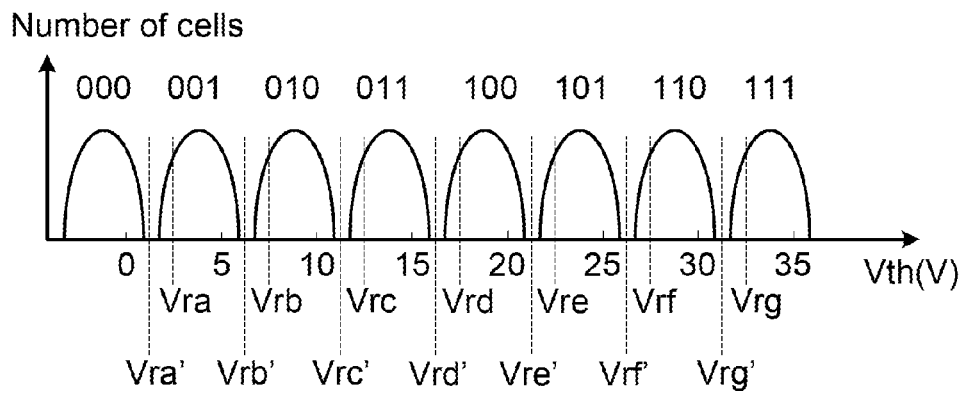
FIG. 2B (prior art) schematically illustrates the shift of the threshold voltage distribution curves of triple-level cells in different storing states.
Figure 3:
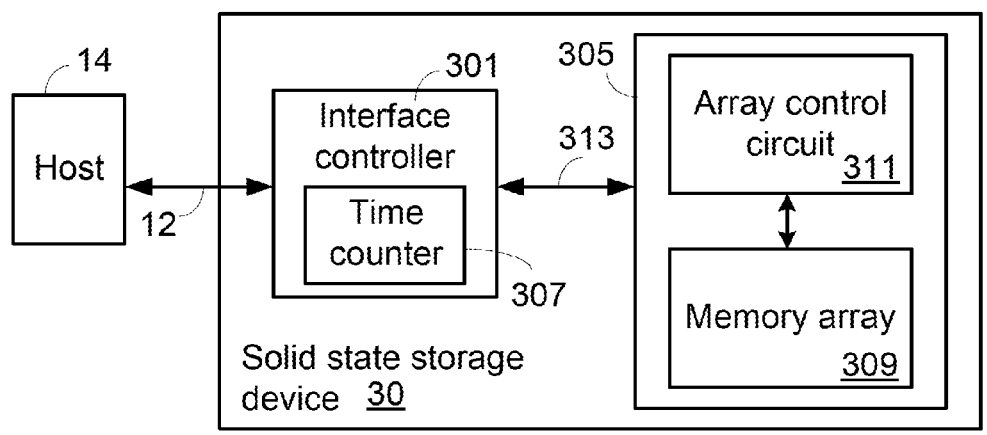
FIG. 3 is a schematic functional block diagram illustrating a solid state storage device according to an embodiment of the present invention.

FIG. 3 is a schematic functional block diagram illustrating a solid state storage device according to an embodiment of the present invention. As shown in FIG. 3, the solid state storage device 30 comprises an interface controller 301 and a non-volatile memory 305. The non-volatile memory 305 further comprises a memory array 309 and an array control circuit 311.

Moreover, the interface controller 301 comprises a time counter 307. When the solid state storage device 30 receives electric power, the time counter 307 increases 1 to a counting value at a fixed time interval. For example, when the solid state storage device 30 is in the power-on state, the time counter 307 increases 1 to the counting value every hour. According to the counting value of the time counter 307, the total operating time (hours) of the solid state storage device 30 is in the power-on state can be realized.

Figure 4A:
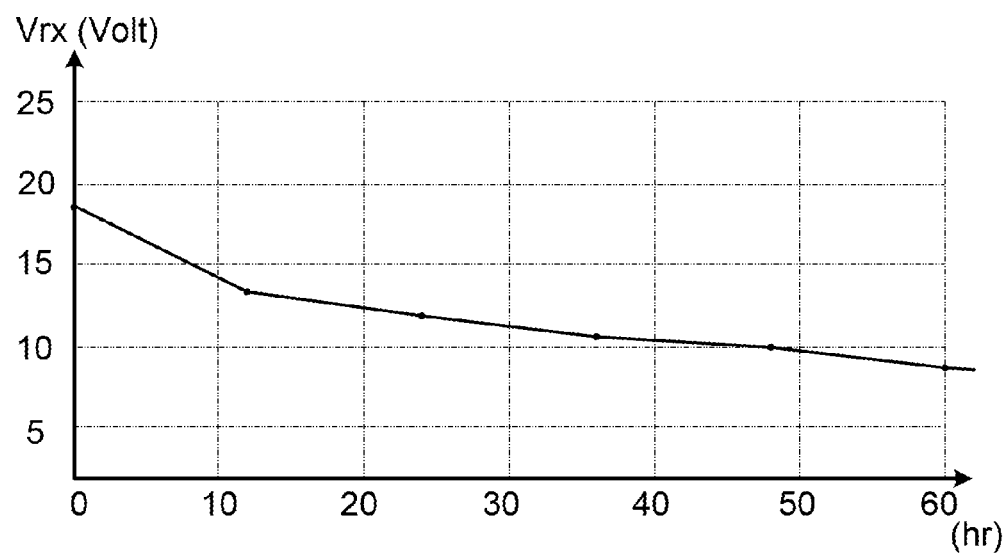
FIG. 4A is a plot illustrating the relationship between the read voltage of the solid state storage device and the time.
Figures 4B, 5:
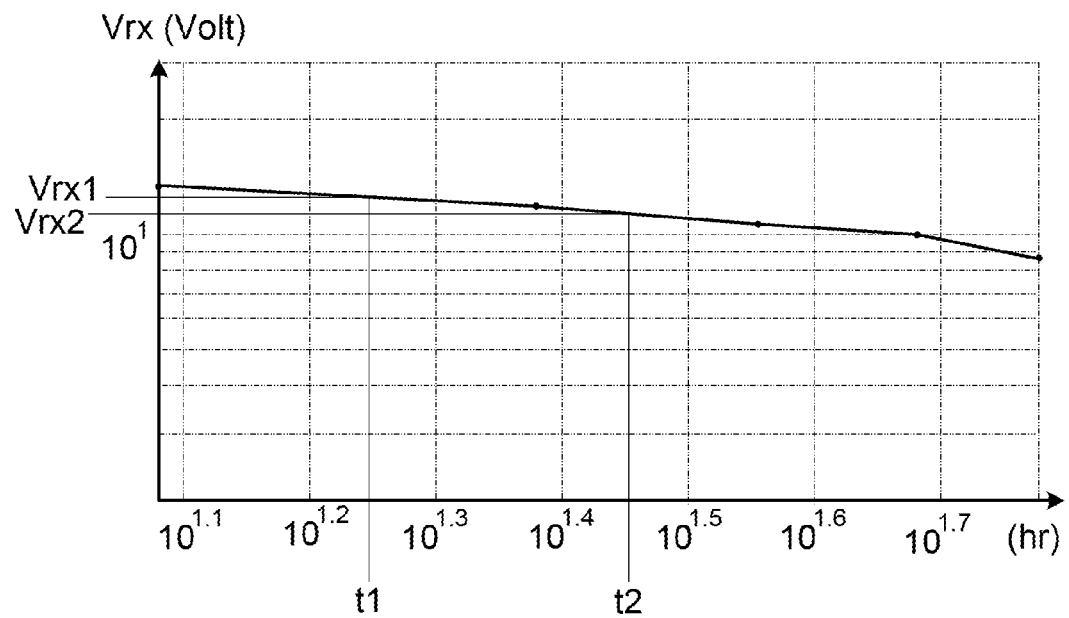
FIG. 4B is a log-log plot illustrating the relationship between the read voltage of the solid state storage device and the time.
FIG. 5 is a table illustrating the relationship between the erase count and the error bit number of a block of the non-volatile memory.

FIG. 4A is a plot illustrating the relationship between the read voltage of the solid state storage device and the time. As mentioned above, the threshold voltage distribution curves of triple-level cells are gradually shifted. Consequently, as shown in FIG. 4A, the read voltage Vrx gradually decreases with the increasing of time. The read voltage Vrx is one voltage of a read voltage set. For example, the read voltage Vrx is the read voltage Vrd. The relationships between the other read voltages of the read voltage set and the time are similar to the relationship between the read voltage Vrd and the time, and thus the detailed descriptions thereof are omitted FIG. 4B is a log-log plot illustrating the relationship between the read voltage of the solid state storage device and the time. In the logarithmic coordinate system, the read voltage Vrx and the time are almost in a linear relationship. Moreover, the slope of the line complies with the following mathematic formula:

$$m = \frac{\log(Vrx1) - \log(Vrx2)}{\log(t1) - \log(t2)}$$

In the above formula, Vrx1 is the read voltage at the time point t1, and Vrx2 is the read voltage at the time point t2. Moreover, the slope m is also defined as a quality parameter. Obviously, the slope m is negative.

Moreover, the quality parameters of different triple-level cells are not always identical. Generally, as the block erase count of the non-volatile memory increases, the performance of the corresponding block is deteriorated and the error bit number of the corresponding block increases. Moreover, since the performance is deteriorated, the quality parameter decreases. Consequently, the quality parameter can be determined according to the block erase count and/or the error bit number of the block.

FIG. 5 is a table illustrating the relationship between the erase count and the error bit number of a block of the non-volatile memory. Before the solid state storage device leaves the factory, the manufacturer may collect the data about various characteristics of the block and create a quality parameter function in off-line. For example, as shown in FIG. 5, a great number of data about the erase counts, the error bit numbers and the quality parameters are collected. Moreover, after a linear regression analysis is performed on the collected data, a quality parameter function m(Ec,Eb) is obtained. For example, m(Ec,Eb)=c1×Ec+c2×Eb, wherein c1 and c2 are constants, Ec is the erase count, and Eb is the error bit number.

Moreover, the quality parameter function is recorded into the interface controller 301 by the manufacturer of the solid state storage device 30. While a background monitoring operation is performed, the interface controller 301 not only correct the read voltage set but also acquire the quality parameter m of each block according to the erase count Ec and the error bit number Eb.

In this embodiment, the quality parameter m is the function of the erase count Ec and the error bit number Eb. It is noted that the examples of the inputs of the quality parameter function are not restricted to the erase count and the error bit number. For example, in another embodiment, the block program time (how long it takes to program the block) and the block erase time (how long it takes to erase the block) can be used as the inputs of the quality parameter function. Generally, once the performance of the non-volatile memory 305 is deteriorated, the block program time decreases and the block erase time increases. Under this circumstance, the quality parameter m is the function of the erase count Ec, the error bit number Eb, the block program time and the block erase time. In some other embodiments, the quality parameter m is the function of the error bit number only.

Figure 6A:
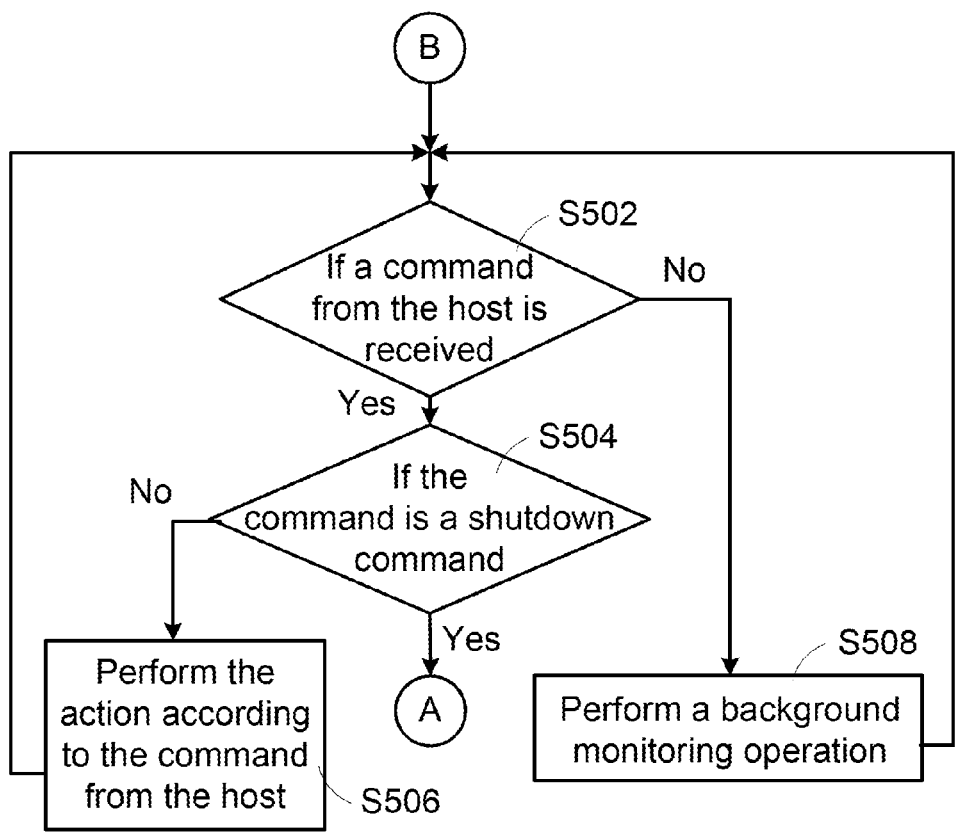
FIGS. 6A and 6B schematically illustrate a flowchart of controlling the solid state storage device according to an embodiment of the present invention.
Figure 6B:
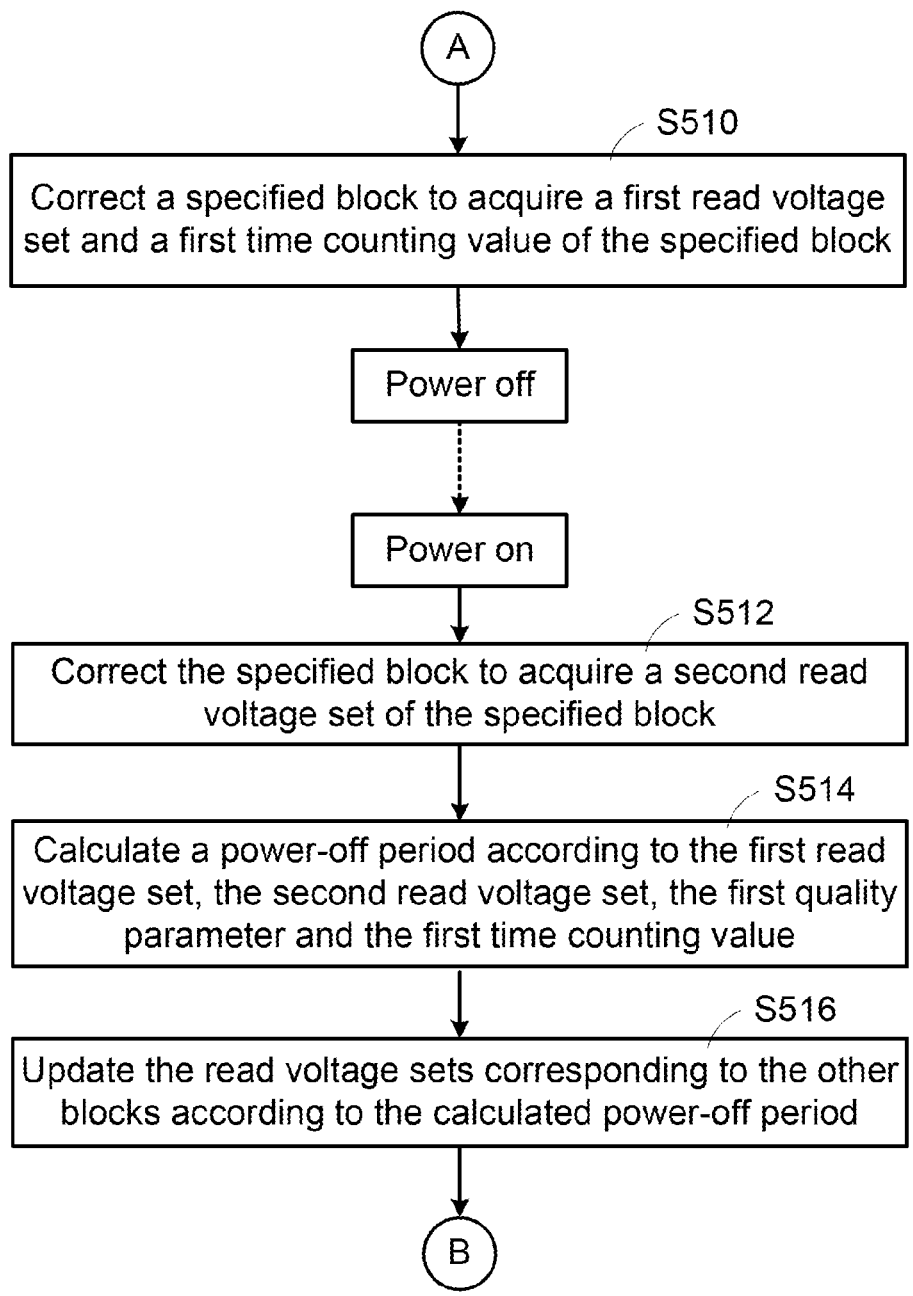

FIGS. 6A and 6B schematically illustrate a flowchart of controlling the solid state storage device according to an embodiment of the present invention. During a normal operation of the solid state storage device 30, the interface controller 301 judges whether a command from the host 14 is received (Step S502). If the interface controller 301 receives a command (Step S502) and the command is not a shutdown command (Step S504), the interface controller 301 performs the action according to the command from the host 14. After the step S506 is completed, the step S502 is repeatedly executed.

For example, in case that the command from the host 14 is a write command, the interface controller 301 controls the array control circuit 311 to store the write data from the host 14 to the memory array 309. Whereas, in case that the command from the host 14 is a read command, the interface controller 301 controls the array control circuit 311 to acquire a read data from the memory array 309. In addition, the read data is transmitted to the host 14 through the interface controller 301.

If no command is received by the interface controller 301 (Step S502), the solid state storage device 30 is in an idle mode. Meanwhile, the interface controller 301 performs a background monitoring operation (Step S508).

While the background monitoring operation is performed, the interface controller 301 monitors and corrects the read voltage set of some blocks in the memory array 309 of the non-volatile memory 305. Moreover, while a block is monitored and threshold-voltage-corrected, the interface controller 301 acquires the corrected read voltage set of the block and calculates the quality parameter of the block according to the quality parameter function. Moreover, the counting value outputted from the time counter 307 is recorded as a time counting value. Consequently, after the block is monitored, the corrected read voltage set, the quality parameter m and the time counting value of the block are acquired. Moreover, after the block is monitored, the corrected read voltage set, the quality parameter m and the time counting value of the block are stored in the non-volatile memory 305 by the interface controller 301.

Moreover, if the command from the host 14 is received again by the interface controller 301 while the background monitoring operation is performed, the background monitoring operation is stopped and the action corresponding to the command is performed. Moreover, when the solid state storage device 30 is in the idle mode again, the interface controller 301 performs the background monitoring operation again and continuously monitors the unmonitored blocks.

Moreover, if the command from the host 14 is the shutdown command (Step S504), the steps as shown in FIG. 6B are performed. After the step S504, the interface controller 301 corrects a specified block to acquire a first read voltage set and a first time counting value of the specified block (Step S510). Moreover, the first read voltage set, a first quality parameter and the first time counting value are stored in the non-volatile memory 305 by the interface controller 301. Then, the solid state storage device 30 is ready to be powered off according to the shutdown command. In an embodiment, the first quality parameter of the specified block is obtained by the interface controller 301 when the background monitoring operation is performed. In another embodiment, the first quality parameter of the specified block is obtained by the interface controller 301 according to the quality parameter when the step S510 is performed.

After the solid state storage device 30 is powered on again, the interface controller 301 corrects the specified block to acquire a second read voltage set of the specified block (Step S512). Then, the interface controller 301 calculates a power-off period according to the first read voltage set, the second read voltage set, the first quality parameter and the first time counting value (Step S514).

For example, when the interface controller 301 receives the shutdown command, the interface controller 301 corrects a specified block of the non-volatile memory 305. Consequently, a first read voltage Vrd1 (e.g., 15V), a first quality parameter m (e.g., −0.45) and a first time counting value t1 (e.g., 200). After the solid state storage device 30 is powered on again, the interface controller 301 corrects the specified block to acquire a second read voltage set Vrd2 (e.g., 10V) of the read voltage set.

As mentioned above, the first read voltage Vrd1 is 15V corresponding to the first time counting value t1 (e.g., 200), and the second read voltage set Vrd2 is 10V corresponding to the second time counting value t2. The first quality parameter m, the first read voltage Vrd1, the second read voltage set Vrd2, the first time counting value t1 and the second time counting value t2 are substituted into the above mathematic formula.

That is, $$m = \frac{\log(Vrx1) - \log(Vrx2)}{\log(t1) - \log(t2)},$$

and thus $$-0.45 = \frac{\log(15) - \log(10)}{\log(200) - \log(t2)}$$

The solution of t2 is 492. Consequently, the power-off period is calculated by the formula: t2−t1=492−200=292 (hours).

Then, the read voltage sets corresponding to the other blocks are updated according to the calculated power-off period (Step S516). As mentioned above, the other blocks are corrected when the background monitoring operation is performed. Consequently, all blocks have the corresponding read voltage sets, quality parameters and time counting values. After the solid state storage device 30 is powered on again and the power-off period is calculated, the read voltage sets of all blocks can be updated.

For example, while the background monitoring operation is performed, the interface controller 301 corrects the first block at the time counting value 170 to obtain the corresponding read voltage Vrx1 (e.g., 17V) and the corresponding quality parameter (e.g., −0.35). After the solid state storage device 30 is powered on again and the power-off period (e.g., 292 hours) is calculated, associated values are substituted into the above mathematic formula.

That is, $$m = \frac{\log(Vrx1) - \log(Vrx2)}{\log(t1) - \log(t2)},$$

and thus $$-0.35 = \frac{\log(17) - \log(Vrx2)}{\log(170) - \log(30 + 292)}$$

The solution of Vrx2 is 13.6. Consequently, the updated read voltage is 13.6V.

After the read voltage sets of all blocks are updated, the steps as shown in FIG. 6A are performed by the interface controller 301.

From the above descriptions, the present invention provides a power-off period estimating method for the solid state storage device 30. The power-off period estimating method is used for estimating a power-off period of the solid state storage device 30. Moreover, the read voltage sets of all blocks of the non-volatile memory 305 are updated by the interface controller 301 according to the calculated power-off period. That is, when the solid state storage device 30 is powered on again, the interface controller 301 can quickly update the read voltage sets of all blocks. Under this circumstance, the access speed of the solid state storage device 30 is largely improved, and thus performance of the solid state storage device 30 is enhanced.

As mentioned above, the power-off period of the solid state storage device 30 is estimated by the power-off period estimating method of the present invention. Firstly, before the solid state storage device 30 is powered off, the interface controller 301 corrects a specified block to acquire a first read voltage set and a quality parameter of the specified block, and the interface controller 301 records a first time counting value of the time counter 307. When the solid state storage device 30 is powered on again, the interface controller 301 corrects the specified block to acquire a second read voltage set. According to the quality parameter, the first read voltage set, the first time counting value and the second read voltage set, the interface controller 301 calculates the power-off period.

After the power-off period is calculated, the interface controller 301 can calculate the updated read voltages sets of all blocks of the non-volatile memory 305 according to the power-off period. The updated read voltages sets are used in the subsequent read action.

In the above embodiments, the triple-level cells are illustrated as the memory cells of the solid state storage device. It is noted that the examples of the memory cells are not restricted to the triple-level cells.

Moreover, after the power-off period of the solid state storage device 30 is acquired, the total power-off period can be accumulated. The sum of the cumulative power-off period and the counting value of the time counter 307 may be defined as a factory-leaving period after the solid state storage device 30 leaves the factory. According to the factory-leaving period, the manufacturer of the solid state storage device 30 may determine the warranty period. It is noted that the application of the factory-leaving period is not restricted. For example, when is the proper time to move the seldom-accessed blocks of the memory array 309 may be determined according to the factory-leaving period.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power-off period estimating method for a solid state storage device, the solid state storage device comprising a non-volatile memory, a memory array of the non-volatile memory comprising plural blocks, the power-off period estimating method comprising steps of:

correcting a first block of the plural blocks at a first time counting value after the solid state storage device is powered on;

acquiring a first read voltage set of the first block of the plural blocks at the first time counting value, and recording the first read voltage set and the first time counting value;

calculating a first quality parameter of the first block according to a quality parameter function, before the solid state storage device is powered off, wherein the first quality parameter corresponds to a performance of the solid state storage device, and when a block erase count of the non-volatile memory increases, the first quality parameter decreases;

powering down the solid state storage device;

acquiring a second read voltage set of the first block, when the first block is corrected after the solid state storage device is re-powered on;

calculating a second time counting value according to the first quality parameter, the first read voltage set, the second read voltage set, and the first time counting value; and subtracting the first time counting value from the second time counting value, thereby obtaining a power-off period.

2. The power-off period estimating method as claimed in claim 1, wherein the first read voltage set of the first block contains a first read voltage, and the second read voltage set of the first block contains a second read voltage, wherein when a first difference between the logarithm of the first read voltage and the logarithm of the second read voltage is divided by a second difference between the logarithm of the first time counting value and the logarithm of the second time counting value, the first quality parameter is obtained.

3. The power-off period estimating method as claimed in claim 1, further comprising steps of:

calculating a second quality parameter of a second block of the plural blocks before the solid state storage device is powered off, wherein when the second block is corrected at a third time counting value, a third read voltage set of the second block is acquired and the third time counting value is recorded; and calculating a fourth read voltage set according to the power-off period, the second quality parameter, the third read voltage set, and the third time counting value after the solid state storage device is re-powered on.

\* \* \* \* \*